(12) United States Patent
Lo

(10) Patent No.: US 8,089,751 B2
(45) Date of Patent: Jan. 3, 2012

(54) PORTABLE MEMORY DEVICE

(76) Inventor: Yu-Nan Lo, Daya Township, Taichung County (TW)

( * ) Notice: Subject to any disclaimer, the term of this patent is extended or adjusted under 35 U.S.C. 154(b) by 127 days.

(21) Appl. No.: 12/765,207

(22) Filed: Apr. 22, 2010

(65) Prior Publication Data

US 2011/0261525 A1 Oct. 27, 2011

(51) Int. Cl.
*G06F 1/16* (2006.01)
*H05K 7/00* (2006.01)
*H05K 5/00* (2006.01)
(52) U.S. Cl. .................... 361/679.31; 439/131; 439/135
(58) Field of Classification Search ............. 361/679.01, 361/679.02, 679.31; 439/131, 135, 136, 439/142
See application file for complete search history.

(56) References Cited

U.S. PATENT DOCUMENTS

| | | | |
|---|---|---|---|
| 6,456,500 B1* | 9/2002 | Chen | 361/752 |
| 6,522,534 B1* | 2/2003 | Wu | 361/679.4 |
| 6,676,419 B1* | 1/2004 | Lin et al. | 439/76.1 |
| 7,035,110 B1* | 4/2006 | Wang et al. | 361/737 |
| 7,095,617 B1* | 8/2006 | Ni | 361/736 |
| 7,172,460 B2* | 2/2007 | Zhao et al. | 439/607.56 |
| 7,361,032 B2* | 4/2008 | Loftus | 439/131 |
| 7,503,780 B1* | 3/2009 | Huang | 439/135 |
| 7,524,198 B2* | 4/2009 | Nguyen et al. | 439/131 |
| 7,672,122 B2* | 3/2010 | Lin et al. | 361/679.31 |
| 7,740,495 B1* | 6/2010 | Lo | 439/142 |
| 7,833,056 B1* | 11/2010 | Lee et al. | 439/607.23 |
| 7,850,468 B2* | 12/2010 | Ni et al. | 439/131 |
| 7,881,051 B2* | 2/2011 | Kim | 361/679.31 |
| 2008/0192149 A1* | 8/2008 | Lee | 348/725 |

* cited by examiner

*Primary Examiner* — Jinhee Lee
*Assistant Examiner* — Adrian S Wilson

(57) ABSTRACT

A portable memory device comprises a housing, a circuit board, and a covering member. The portable memory device is convenient to use since the plug of the memory device can be easily exposed or covered simply by a pulling or pushing action. Furthermore, no matter whether the portable memory device is in use or not, its rear end is always closed to prevent foreign objects from entering the housing and causing damage to the circuit board.

5 Claims, 5 Drawing Sheets

PORTABLE MEMORY DEVICE

BACKGROUND OF THE INVENTION

1. Field of the Invention

The present invention relates to a memory device, and more particularly to a portable memory device.

2. Description of the Prior Art

A conventional flash disk (namely portable memory device) is normally provided with a cover to protect the plug of the flash disk. When the cover is taken off, the plug can be plugged into the USB port of a computer to transmit data to and from the flash disk. However, the cover is likely to be lost because of the user's negligence. Therefore, many more designs are created to solve the cover-lost problem, however, no matter how the designs change, the cover is always undetachably fixed to the flash disk as to prevent the cover from getting lost. For example, one of the designs is such that the cover is undetachably fixed to the body of the flash disk, and to use the flash disk, the cover should be pulled out of the plug of the flash disk to the from end of the flash disk and then turned 180 degrees, after that, the cover is pushed backward to the rear end of the flash disk. Hence, such a flash disk is structurally complicated and inconvenient to use.

The present invention has arisen to mitigate and/or obviate the afore-described disadvantages.

SUMMARY OF THE INVENTION

The primary object of the present invention is to provide a portable memory device which is very convenient to use since the plug of the memory device can be easily exposed or covered simply by a pulling or pushing action.

Another object of the present invention is to provide a portable memory device, no matter whether the portable memory device is in use or not, its rear end is always closed to prevent foreign objects from entering the housing and causing damage to the circuit board.

To achieve the above objects, a portable memory device in accordance with the present invention comprises a housing, a circuit board, and a covering member. The housing is formed in a front end surface thereof with a front port in communication with an interior of the housing, and a rear end surface of the housing is provided with a jointing portion and a rear port in communication with the chamber, the housing is provided on each of the two side surfaces with a guiding groove. The circuit board includes a plug and a connecting portion at both ends thereof and is slidably disposed in the housing with the plug selectively sliding out of or back into the front port. The covering member includes a first covering portion and a second covering portion formed at one end of the first covering portion, another end of the first covering portion is pivoted to the connecting portion of the circuit board, at both sides of the first covering portion are formed two protrusions to be slidably received in the guiding grooves. When the plug is retracted into the front port, the first and second covering portions will close the rear port, when the plug extends out of the front port, the second covering portion cooperates with the jointing portion to close the rear port.

DETAILED DESCRIPTION OF THE PREFERRED EMBODIMENTS

The present invention will be clearer from the following description when viewed together with the accompanying drawings, which show, for purpose of illustrations only, the preferred embodiment in accordance with the present invention.

Figure 1:
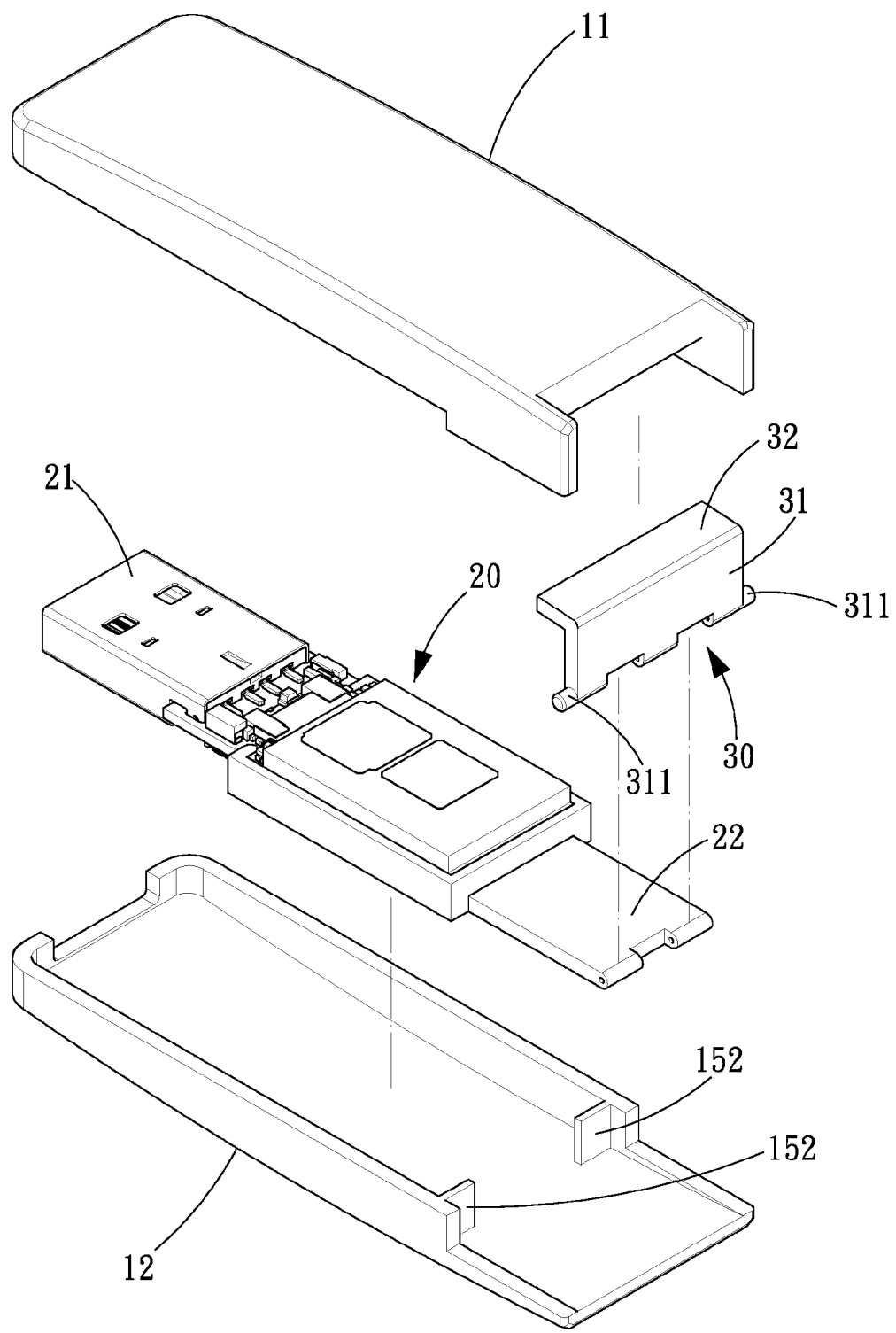
FIG. 1 is an exploded view of a portable memory device in accordance with the present invention.
Figure 2:
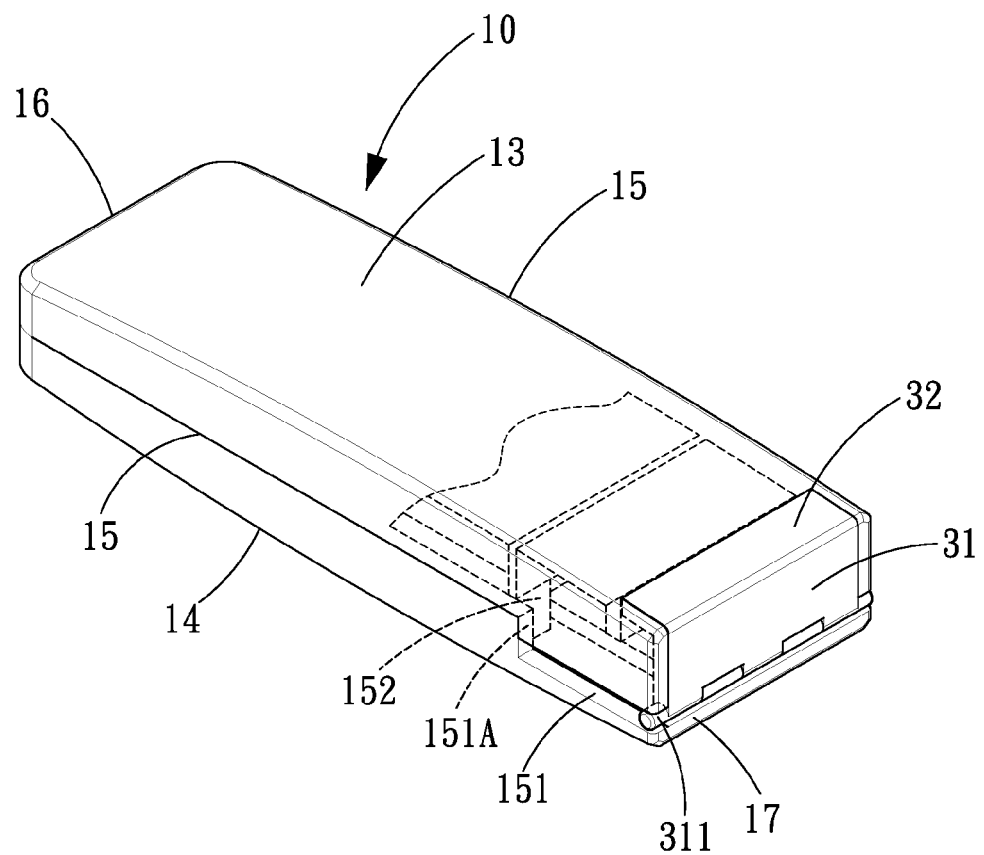
FIG. 2 is an assembly view of the portable memory device in accordance with the present invention.
Figure 3:
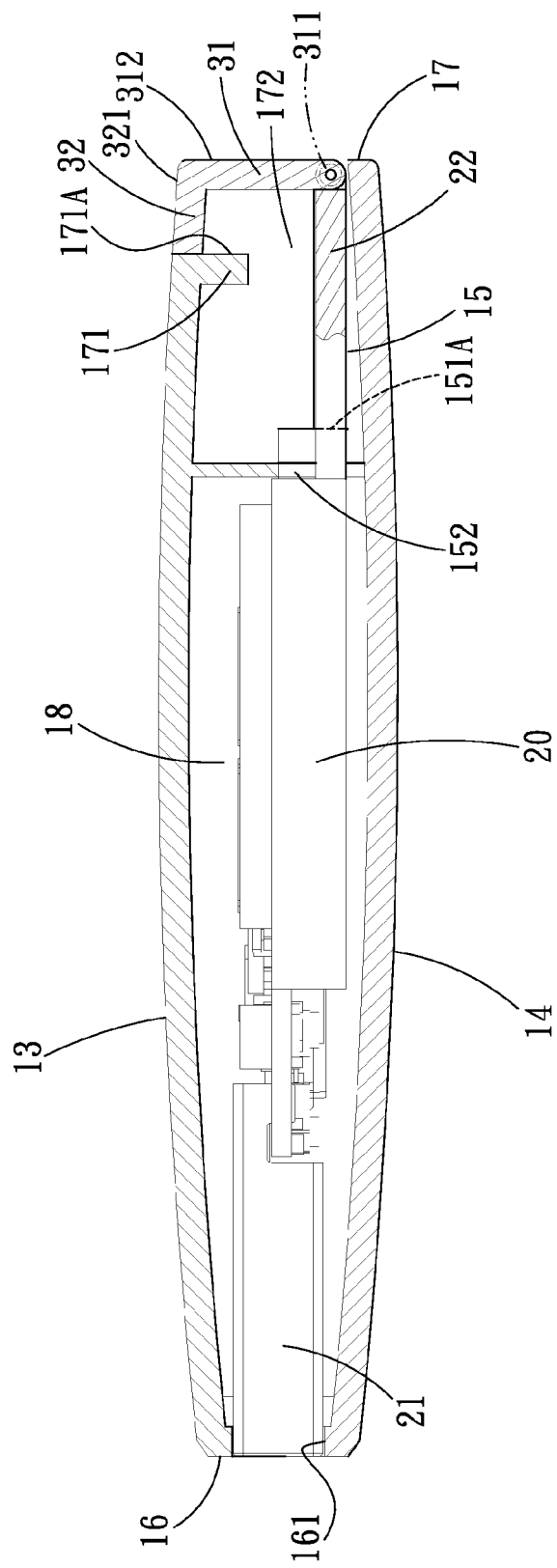
FIG. 3 is a cross sectional view of the portable memory device in accordance with the present invention.

Referring to FIGS. 1-3, a portable memory device in accordance with a preferred embodiment of the present invention comprises: a housing 10, a circuit board 20 and a covering member 30.

The housing 10 is formed by an upper cover 11 and a lower cover 12 and includes an upper surface 13, a lower surface 14, two side surfaces 15 connected between the upper and lower surfaces 13, 14, and a front end surface 16 and a rear end surface 17, which cooperate together to define a chamber 18. In the front end surface 16 is formed a front port 161 in communication with the chamber 18, and the rear end surface 17 is provided with a jointing portion 171 and a rear port 172 in communication with the chamber 18. The rear end surface 17 is partially concave toward the front end surface 16 to form a jointing portion 171 which extends downward from the upper surface 13. The housing 10 is provided on each of the two side surfaces 15 with a guiding groove 151 extending from the rear end surface 17 toward the front end surface 16. Each of the two side surfaces 15 is further provided with a stop portion 152 which is located close to the jointing portion 171.

The circuit board 20 includes a plug 21 at one end and a connecting portion 22 with concave and convex configurations at the other. The circuit board 20 is slidably disposed in the chamber 18 of the housing 10 in such a manner that the plug 21 selectively slides out of or back into the front port 161, and the circuit board 20 is stopped by the stop portions 152 from disengaging from the rear port 172, while the connecting portion 22 is capable of sliding between the two stop portions 152.

The covering member 30 includes a first covering portion 31 which has one end folded to form a second covering portion 32. Another end of the first covering portion 31 has concave and convex configurations and is pivoted to the connecting portion 22 of the circuit board 20. At both sides of the first covering portion 31 there are two protrusions 311 to be slidably abutted against a bottom 151A of the guiding grooves 151, so as to prevent the circuit board 20 from disengaging from the front port 161.

When the plug 21 is retracted into the front port 161, the first and second covering portions 31, 32 will cover the rear port 172 in such a manner that an outer surface 312 of the first covering portion 31 is flush with the rear end surface 17 of the housing 10, and an outer surface 321 of the second covering portion 32 is flush with the upper surface 13 of the housing 10. When the plug 21 extends out of the front port 161, the second covering portion 32 cooperates with the jointing portion 171 to close the rear port 172, meanwhile, the outer surface 321 of the second covering portion 32 is flush with the outer surface 171A of the jointing portion 171.

The abovementioned are the relations of the main components of the extensible portable memory device in accordance with the present invention, and functions and operations of the embodiment of the present invention are described as follows.

Referring to FIG. 3, which shows that the portable memory device in accordance with the present invention is in a non-use state where the plug 21 of the circuit board 20 is retracted into the front port 161, and the first and second covering portions 31, 32 close the rear port 172. Meanwhile, the first covering portion 31 is flush with the rear end surface 17 of the housing 10, the second covering portion 32 is abutted against the outer surface 171A of the jointing portion 171, and the outer surface 321 of the second covering portion 32 is flush with the upper surface 13 of the housing 10. By such arrangements, the plug 21 is closed in the housing, and the rear port 172 is closed for keeping foreign objects from entering the housing 10.

Figure 4:
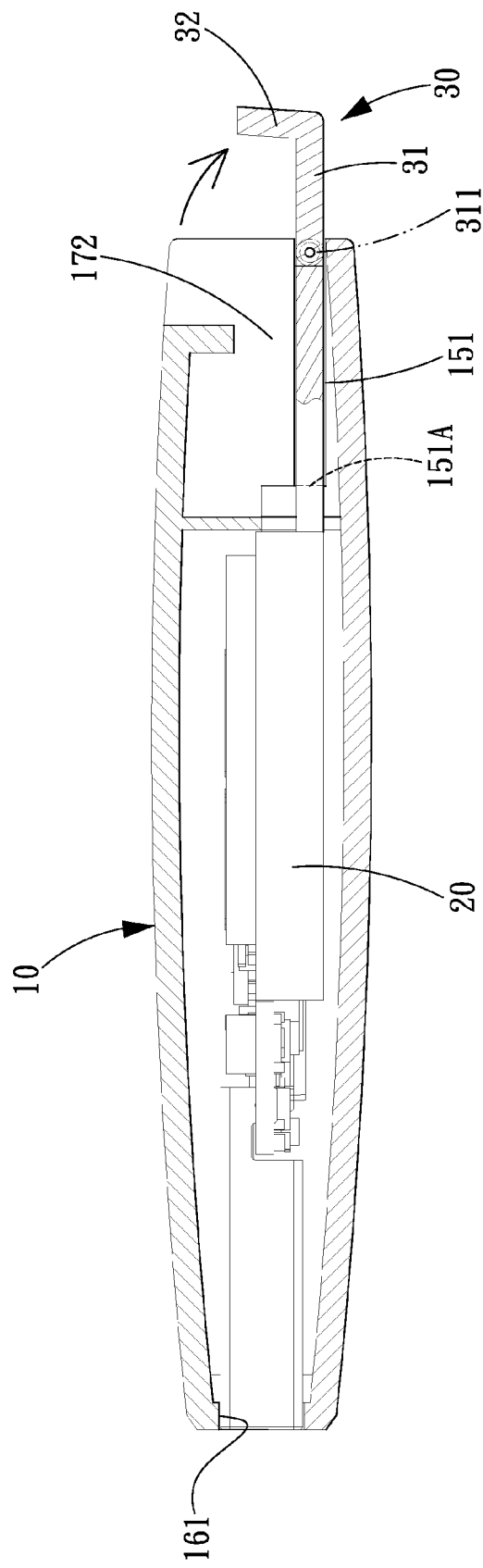
FIG. 4 is an operational view of the portable memory device in accordance with the present invention showing that the covering member is turned an angle.
Figure 5:
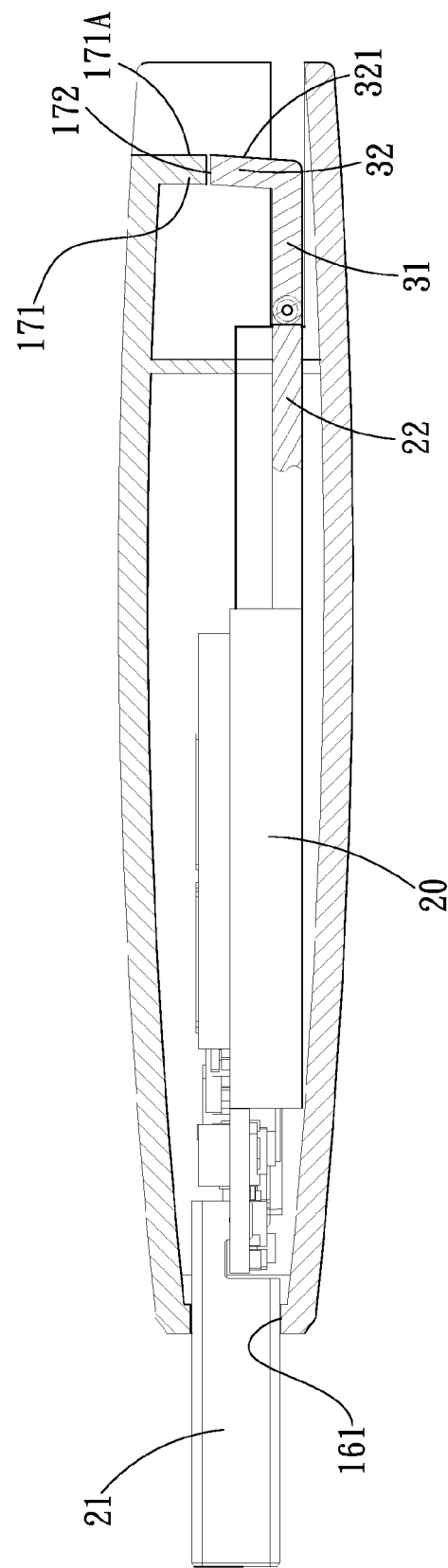
FIG. 5 is an operational view of the portable memory device in accordance with the present invention showing that the covering member covers the rear port of the housing.

Referring to FIGS. 4 and 5, which show how the portable memory device is turned from non-in use state to in-use state. Firstly, the user can turn the covering member 30 is an angle to make the first covering portion 31 lie down, and then push the covering member 30 to make the circuit board 20 slide from the rear port 172 to the front port 161 of the housing 10 until the two protrusions 311 of the covering member 30 are stopped against the bottoms 151A of the guiding grooves 151 of the housing 10. At this moment, the plug 21 of the circuit board 20 is exposed out of the front port 161 and can be plugged in other electronic equipments to transmit data. Meanwhile, the second covering portion 32 is located underneath the jointing portion 171, and the outer surface 321 of the second covering portion 32 is flush with the outer surface 171A of the jointing portion 171, and thus the rear port 172 of the portable memory device is closed to prevent foreign objects from entering the housing 10.

After having finished using the portable memory device, the user can follow the above steps reversely, namely, pushing the plug 21 of the circuit board 20 back into the front port 161 of the housing 10, and then pulling the covering member 30 making it cover the rear port 172 of the housing 10.

The portable memory device in accordance with the present invention is very convenient to use since the plug of the memory device can be easily exposed or covered simply by a pulling or pushing action. Furthermore, no matter whether the portable memory device is in use or not, its rear end is always closed to prevent foreign objects from entering the housing and causing damage to the circuit board.

While we have shown and described various embodiments in accordance with the present invention, it is clear to those skilled in the art that further embodiments may be made without departing from the scope of the present invention.

What is claimed is:

1. A portable memory device comprising:
    a housing being formed in a front end surface thereof with a front port in communication with an interior of the housing, and a rear end surface of the housing being provided with a jointing portion and a rear port in communication with the housing, the housing being provided on each of the two side surfaces with a guiding groove;
    a circuit board including a plug and a connecting portion at both ends thereof and being slidably disposed in the housing with the plug selectively sliding out of or back into the front port;
    a covering member including a first covering portion and a second covering portion formed at one end of the first covering portion, another end of the first covering portion being pivoted to the connecting portion of the circuit board, at both sides of the first covering portion being formed two protrusions to be slidably received in the guiding grooves;
    when the plug is retracted into the front port, the first and second covering portions will close the rear port, when the plug extends out of the front port, the second covering portion cooperates with the jointing portion to close the rear port.

2. The portable memory device as claimed in claim 1, wherein the housing includes an upper surface, a lower surface, and two side surfaces connected between the upper and lower surfaces, when the first and second covering portions cover the rear port, an outer surface of the first covering portion is flush with the rear end surface of the housing, and an outer surface of the second covering portion is flush with the upper surface of the housing, when the second covering portion cooperates with the jointing portion to close the rear port, the outer surface of the second covering portion is flush with the outer surface of the jointing portion.

3. The portable memory device as claimed in claim 1, wherein the housing is formed by an upper cover and a lower cover.

4. The portable memory device as claimed in claim 1, wherein two stop portions are formed in the housing to stop the circuit board from disengaging from the rear port, and the connecting portion is allowed to slide between the two stop portions.

5. The portable memory device as claimed in claim 1, wherein the guiding grooves extend from the rear end surface toward the front end surface of the housing, and the protrusions of the covering member are slidably abutted against a bottom of the guiding grooves.

* * * * *